United States Patent [19]

Rokos

[11] Patent Number: 4,890,191

[45] Date of Patent: Dec. 26, 1989

[54] INTEGRATED CIRCUITS

[75] Inventor: George H. S. Rokos, Bishop's Stortford, Great Britain

[73] Assignee: STC PLC, London, England

[21] Appl. No.: 304,421

[22] Filed: Jan. 31, 1989

[30] Foreign Application Priority Data

Feb. 23, 1988 [GB] United Kingdom ............... 8804178

[51] Int. Cl.⁴ ..................... H01L 7/36; H01L 27/02
[52] U.S. Cl. ..................................... 361/313; 357/51
[58] Field of Search ............................. 361/311–313; 357/51

[56] References Cited

U.S. PATENT DOCUMENTS 3,547,716 12/1970 De Witt et al. .................. 357/51 X
3,764,409 10/1973 Nomura et al. .................. 357/51 X
3,860,836 1/1975 Pedersen ........................... 357/51 X
4,167,018 9/1979 Ohba et al. ......................... 357/51
4,758,873 7/1988 Monticelli ........................... 357/51

Primary Examiner—Donald A. Griffin
Attorney, Agent, or Firm—Lee, Mann, Smith, McWilliams & Sweeney

[57] ABSTRACT

In a semi-custom integrated circuit, e.g. a bipolar analogue array, underpass areas are so configured as to permit operation as capacitors by suitable configuration of a user determined interconnection pattern. Typically each underpass comprises a highly doped region disposed over a buried layer. A thin oxide layer is applied to the surface of the underpass. Suitable configuration of polysilicon and metal masks provides either a crossover or a capacitor.

1 Claim, 1 Drawing Sheet

INTEGRATED CIRCUITS

This invention relates to integrated circuits, and in particular to the provision of capacitors in said circuits.

Semi-custom integrated circuits generally comprise an array of active and passive devices, defined by the manufacturer, that is connected in a particular way to a customer's requirement by the use of suitable customer defined masks. The versatility of these circuits is limited by the problems of providing large value capacitors which occupy a relatively large proportion of chip area and which may not be required by all customers. If such capacitors are provided by the manufacturer on chip, the necessary inbuilt redundancy represents an inefficient use of chip area.

The object of the present invention is to mimimize or to overcome this disadvantage.

According to the invention there is provided an integrated circuit, including an array of devices adapted to be interconnected to perform a desired circuit function by the application to the circuit of a user determined interconnection pattern, and a plurality of conductive underpasses, wherein said underpasses are each so constructed as to permit configuration by the user determined interconnection pattern as a capacitor.

According to the invention there is further provided an integrated circuit, including an array of devices disposed on a semiconductor substrate and adapted to perform a desired circuit function by the application to the circuit of a user determined interconnection pattern, and a plurality of low resistivity regions formed in said substrate and each provided with a surface oxide film having openings whereby electrical contact may be effected to the low resistivity region, the arrangement being such that, by the application to the circuit of said conductor pattern at least some of said low resistivity regions provide either a circuit underpass or a capacitor.

An embodiment of the invention will now be described with reference to the accompanying drawings in which.

Figure 1:
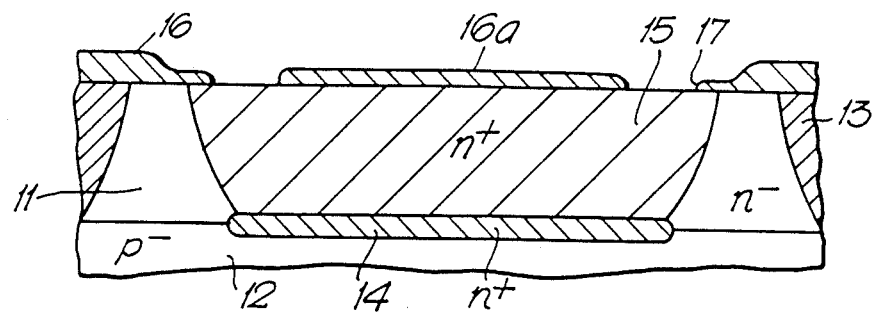
FIG. 1 is a schematic sectional view of a capacitor configurable underpass structure.

Referring to FIG. 1, the structure shown therein is provided by the circuit manufacturer as a non-custom structure. The structure is formed in an $n^-$-type epitaxial layer 11 on a $p^{--}$-type silicon substrate 12 and is isolated from adjacent devices by p-type regions 13. A buried $n^+$-type layer 14 is disposed at the boundary of the epitaxial layer 11 with the substrate 12. Above this buried layer a deep $n^-$-type region 15 is provided extending into the epitaxial layer 14. An oxide layer 16, 16a is formed over the structure and is provided with windows 17 whereby the deep $n^+$-type region may be contacted by a subsequently applied polycrystalline silicon (polysilicon) layer (not shown in FIG. 1). The oxide layer 16a over the deep $n^+$-type region 15 is relatively thin and is typically 1000 to 1500 A in thickness.

The structure of FIG. 1 is configured either as an underpass or as a capacitor by the provision of customised polysilicon and metal layers. It will be appreciated that the structure of FIG. 1 may also be fabricated with dopants of the opposite conductivity type.

Figure 2:
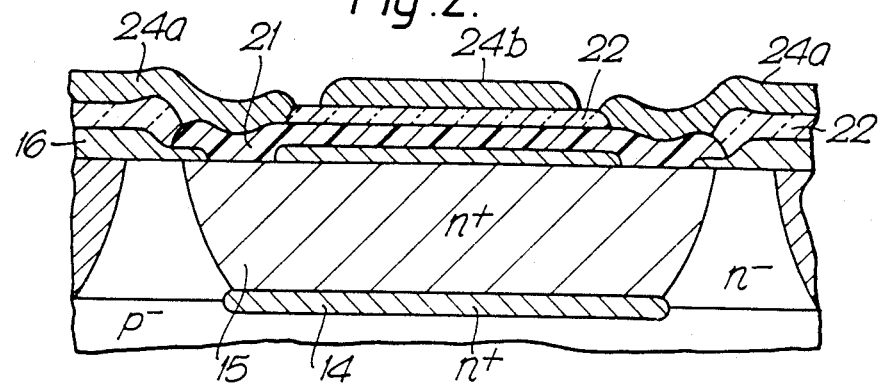
FIG. 2 illustrates the use of the structure of FIG. 1 as an underpass.

FIG. 2 illustrates the use of the structure of FIG. 1 in the provision of a cross-over between conductors. A (custom) polysilicon layer 21 is applied to the structure so as to contact the $n^+$-type region via the openings 17 in the oxide layer 16, 16a. An insulator layer 22, typically of a phospho-borosilicate glass (BPSG), is next applied, and windows 23 are formed to expose the underlying polysilicon 21. Finally a metal layer 24a, 24b is applied to define the cross-over In use current flowing via the portions 24a of the metal layer flows through the underpass via three parallel paths. This current flows via the polysilicon layer 21, the $n^+$-type region 15 and the buried $n^+$-type layer 14. In this way a low resistance current path is provided. Current is also carried in the transverse direction via the portion 24b of the metal layer. Isolation between the current paths is provided by the insulator 22.

Figure 3:
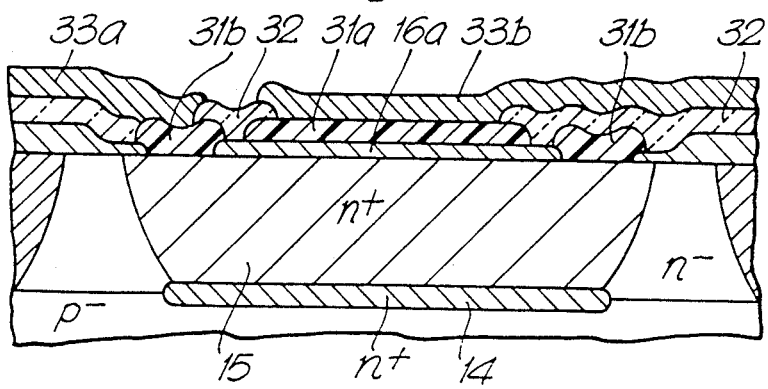
FIG. 3 illustrates the use of the structure of FIG. 1 as a capacitor.

Use of the structure of FIG. 1 in the formation of a capacitor is shown in FIG. 3 of the accompanying drawings In this arrangement, the structure of FIG. 1 is provided with a (custom) polysilicon layer 31a, 31b. This layer is so configured that the portion 31a disposed over the oxide layer 16a is electrically isolated from the portions 31b which latter portions provide contact to the $n+$-type region 15. Insulating material 32, e.g. BPSG, is provided as before, followed by a metallisation layer 33a, 33b. One portion 33a of the metallisation is connected via the polysilicon contact 31b to the $n^+$-type layer 15, this layer providing one plate of the capacitor structure. The other portion 33b of the metallisation is connected to the portion 31a of the polysilicon layer which provides the other plate of the capacitor. The thin oxide layer 16a provides the capacitor dielectric. The value of the capacitor is determined by the area and thickness of the oxide layer 16a.

It will be appreciated from the foregoing description that the basic structure provided by a manufacturer may subsequently be defined by the customer as a cross-over or a capacitor by the use of appropriate custom masks. This increases the versatility of the integrated circuit.

In a particularly advantageous form, the integrated circuit comprises an array of bipolar transistors, e.g. an analogue array, each having a polysilicon emitter. The custom polysilicon layer can then be deposited simultaneously with the emitters. It will however be understood that the technique is not limited to this application but may also be used with other semiconductor technologies.

I claim:

1. In an integrated circuitg a conductor cross-over structure including:
 (a) a $p^-$-type silicon substrate;
 (b) an $n^-$-type epitaxial layer disposed on the substrate;
 (c) a buried $n^-$-type region extending through the epitaxial layer and the substrate;
 (d) an $n^+$-type region extending through the epitaxial layer and providing electrical contact to the buried layer;
 (e) an oxide layer disposed on the epitaxial layer having spaced openings each exposing a portion of the $n^+$-type region;
 (f) a polysilicon layer applied to the oxide layer and contacting the $n^+$-type region via the windows;
 (g) an insulator layer applied to a polysilicon layer and having spaced openings each exposing a portion of the polysilicon layer; and (h) a patterned metallisation layer providing a conductor track and contacts to the polysilicon layer via said openings in the insulator layer;
wherein said conductor track provides a first current path of the cross-over, and wherein the parallel combination of the polysilicon layer, the $n^+$-type region and the $n^+$-type buried layer provides a second current path of the cross-over.

* * * * *